US006496959B1

(12) United States Patent
Noguchi

(10) Patent No.: US 6,496,959 B1
(45) Date of Patent: Dec. 17, 2002

(54) METHOD AND SYSTEM FOR ESTIMATING PLASMA DAMAGE TO SEMICONDUCTOR DEVICE FOR LAYOUT DESIGN

(75) Inventor: Ko Noguchi, Tokyo (JP)

(73) Assignee: NEC Corporation, Tokyo (JP)

( * ) Notice: Subject to any disclaimer, the term of this patent is extended or adjusted under 35 U.S.C. 154(b) by 127 days.

(21) Appl. No.: 09/616,947

(22) Filed: Jul. 14, 2000

(30) Foreign Application Priority Data

Jul. 14, 1999 (JP) .......................................... 11-201019

(51) Int. Cl.$^7$ .......................... G06F 17/50; A61N 5/00; H01L 29/04; H01L 27/00; H01L 27/10; H01L 27/336; H01L 27/4763; G01R 31/26
(52) U.S. Cl. .................................. 716/4; 716/5; 716/11; 250/492.2; 257/48; 257/208; 324/769; 438/9; 438/291; 438/640
(58) Field of Search ............................................. 716/4

(56) References Cited

U.S. PATENT DOCUMENTS

| | | | | |
|---|---|---|---|---|
| 4,493,745 A | * | 1/1985 | Chen et al. ..................... | 438/9 |
| 5,198,986 A | * | 3/1993 | Ikeda et al. ..................... | 716/5 |
| 5,959,311 A | * | 9/1999 | Shih et al. ..................... | 257/48 |
| 6,005,409 A | * | 12/1999 | Bui et al. ..................... | 324/769 |
| 6,028,324 A | * | 2/2000 | Su et al. ......................... | 257/48 |
| 6,144,037 A | * | 11/2000 | Ryan et al. ............... | 250/492.2 |
| 6,150,261 A | * | 11/2000 | Hsu et al. ..................... | 438/640 |
| 6,187,639 B1 | * | 2/2001 | Wang et al. ................. | 438/291 |
| 6,292,927 B1 | * | 9/2001 | Gopisetty et al. ............. | 716/11 |
| 6,396,075 B1 | * | 5/2002 | Krishnan ..................... | 257/208 |

FOREIGN PATENT DOCUMENTS

JP   A 11-186394   7/1999

* cited by examiner

Primary Examiner—Vuthe Siek
Assistant Examiner—Andrea Liu
(74) Attorney, Agent, or Firm—Young & Thompson

(57) ABSTRACT

A system for estimating a plasma damage for subsequent layout design of a semiconductor device includes an antenna ratio extraction unit for extracting an antenna ratio from each of existing provisional layout patterns to be exposed to plasma in each of plasma processes. An index calculation unit is connected to the antenna ratio extraction unit for receiving the antenna ratio extracted by the antenna ratio extraction unit and calculating an individual damage index representing a degree of a plasma damage in accordance with the antenna ratio. An index addition unit is connected to the index calculation unit for receiving the individual damage indexes from the index calculation unit and adding the individual damage indexes to estimate a plasma damage.

26 Claims, 9 Drawing Sheets

METHOD AND SYSTEM FOR ESTIMATING PLASMA DAMAGE TO SEMICONDUCTOR DEVICE FOR LAYOUT DESIGN

BACKGROUND OF THE INVENTION

The present invention relates to a method and a system for estimating a plasma damage to a semiconductor device, for example, a gate insulation film, for a layout design of the semiconductor device, and more particularly to a storage medium storing a support program for the layout design.

Semiconductor devices such as microprocessors and semiconductor memories have various active and passive devices and interconnection inter-connecting them which are integrated over a single crystal semiconductor substrate such as a silicon substrate. MOS field effect transistors are often utilized as active devices as being advantageous in realizing the required high integration. The MOS field effect transistor has the following essential structural elements. Source and drain regions are selectively formed in the semiconductor substrate by selective ion-implantation of n-type impurity such as arsenic or p-type impurity such as boron. A channel region is defined between the source and drain regions. A gate insulation film such as silicon dioxide film is formed on the channel region. A gate electrode such as a polysilicon gate electrode is formed on the gate insulation film.

In the manufacturing processes for the semiconductor devices, a dry etching process using a plasma is carried out. For example, the interconnections are formed as follows. An interconnection material such as aluminum is entirely deposited over the semiconductor substrate on which transistors have already been formed. A resist is applied on the interconnection material. An exposure and a development to the resist are then carried out to form a resist pattern on the interconnection material. A plasma etching to the interconnection material is carried out by use of the resist pattern as a mask, thereby forming an interconnection. This plasma etching is advantageous in high etching selectively. This plasma etching is superior for realizing shrinkage of the semiconductor device and increasing the degree of integration of the semiconductor devices.

As the MOS field effect transistor is scaled down, the thickness of the gate insulation film is reduced. It will be considered that an aluminum interconnection is formed which is connected to the gate. Charge of the charge particles of the plasma is supplied through the interconnection to the gate. As a result, a current flows through the gate insulation film, whereby the gate insulation film receives a substantive damage upon the current. Thus causes a drop of yield of the semiconductor device and also a drop in reliability of the semiconductor device. The damage that the gate insulation film receives in the process using the plasma is so called as a plasma damage. The degree of the plasma damage depends upon a size of the interconnection being exposed to the plasma and capturing the charges of the charge particles of the plasma.

FIG. 1 is a fragmentary schematic perspective view illustrative of a semiconductor device to explain a mechanism of causing the plasma damage to the gate insulation film. Field oxide films 3 are selectively formed on a surface of a semiconductor substrate 1 so that an active region 2 is defined by the field oxide film 3. A gate oxide film 4 is formed on the active region 2 of the semiconductor substrate 1. A gate electrode 5 is formed, which extends over the gate oxide film 4 and parts of the field oxide films 3. An inter-layer insulator 6 is entirely formed over the gate electrode 5 and the field oxide film 3. A through hole 7 is formed in the inter-layer insulator 6 and over the gate electrode 5, so that the through hole 7 reaches a part of the top surface of the gate electrode 5.

An aluminum layer is entirely deposited over the inter-layer insulator and also within the through hole 7, so that the aluminum layer within the through hole 7 is in contact with the part of the top surface of the gate electrode 5. A resist is entirely applied on the aluminum layer and then baked. The resist is patterned by a lithography technique to form a resist pattern 9 on the aluminum layer. A plasma etching to the aluminum layer is then carried out by use of the resist pattern 9 as a mask to form an aluminum interconnection 8.

The resist pattern 9 exists over the aluminum interconnection 8. A top surface of the aluminum interconnection 8 is covered by the resist pattern 9 and separated from the plasma, whilst side portions of the aluminum interconnection 8 are exposed to the plasma. Charges of the charge particles of the plasma are captured through the side portions of the aluminum interconnection 8. Namely, the side portions of the aluminum interconnection 8 serve as antenna for capturing the charges of the charge particles of the plasma. The captured charges are supplied through the through hole 7 to the gate electrode 5, whereby the gate electrode 5 is positively charged. As the gate electrode 5 is charged, then a current flows through the gate oxide film 4, whereby the gate oxide film 4 receives the plasma damage. As an area of side walls or side portions of the aluminum interconnection 8 is increased, then the degree of the plasma damage to the gate oxide film 4 is also increased. In general, the degree of the plasma damage to the gate oxide film 4 is approximately proportional to a density of the current.

If the thickens of the aluminum interconnection 8 is fixed, then the amount of the current flowing through the gate oxide film 4 is almost proportional to a length of the circumference of the aluminum interconnection 8, whilst the amount of the current flowing through the gate oxide film 4 is almost inversely proportional to the area of the gate oxide film 4. In prior art, the following antenna ratio "R" is used as an index which represents the degree of the plasma damage.

$$"R"=M/S$$

where M is the length of the circumference of the aluminum interconnection 8, and S is the area of the gate oxide film 4. The length of the circumference of the aluminum interconnection 8 is almost equal to double of the length of the aluminum interconnection 8.

In consideration of the plasma damage to the gate oxide film 4 due to the charge particles of the plasma, a maximum antenna ratio "Rmax" is previously determined as a design rule, wherein the maximum antenna ratio "Rmax" corresponds to the highest value of acceptable range of the degree of the plasma damage to the gate oxide film. The layout design for the semiconductor device is carried out so that the antenna ratio "R" is not more than the maximum antenna ratio "Rmax".

It is assumed that the interconnection comprises laminations of three layers, for example, a first metal layer M1, a second metal layer M2, and a third metal layer M3. If the plasma etching process is carried out to form each of the first, second, and third metal layers of the interconnection, then the antenna ratio "R" of the interconnection corresponds to the sum ΣR of individual antenna ratios of the first, second, and third metal layers of the interconnection. In this case, the layout design for the interconnection is carried out so that the sum ΣR of individual antenna ratios of the first, second, and third metal layers is not more than the maximum antenna ratio "Rmax".

If the interconnection layer comprises laminations of plural layers, then a contact within the contact hole also comprises the laminations of plural layers. The layout design is carried out so that the total sum of the individual antenna ratios of the plural layers does not exceed the maximum antenna ratio "Rmax". The bottom of the contact within the through hole serves as an antenna. The amount of the current flowing through the gate oxide film 4 is almost proportional to the area of the bottom of the through hole 7 and also almost inversely proportional to the area of the gate oxide film 4. The area of the bottom of the through hole 7 corresponds to the antenna size M so that the antenna ratio "R" is calculated.

The above conventional technique is to take a measure to the plasma damage in the processes of layout design. It has also been known that the measure to the plasma damage is taken in the manufacturing processes.

In Japanese laid-open patent publication No. 10-247638, it is disclosed to prevent a plasma damage in aching to a resist pattern with a plasma aching, wherein the resist pattern is to be used as a mask for dry etching to the gate electrode. In this conventional technique, an insulation film is additionally formed on the gate oxide film and a resist pattern is then formed on the insulation film. When the resist pattern is ached by the plasma, then the gate oxide film is covered or protected by the insulation film, whereby the gate electrode is not charged by the plasma. As a result, the plasma damage is prevented.

In Japanese laid-open patent publication No. 10-247638, it is disclosed to prevent a plasma damage in etching to a resist pattern with a plasma etching, wherein the resist pattern is to be used as a mask for dry etching to the gate electrode. In this conventional technique, an insulation film is additionally formed on the gate oxide film and a resist pattern is then formed on the insulation film. When the resist pattern is etched by the plasma, then the gate oxide film is covered or protected by the insulation film, whereby the gate electrode is not charged by the plasma. As a result, the plasma damage is prevented.

In Japanese laid-open patent publication No. 5-30855, it is disclosed to prevent the plasma damage to the gate oxide film in the process of forming the gate electrode. The etching process for etching the gate electrode is carried out by multiple steps of a magnetic field applied high density plasma etching and a magnetic field free high density plasma etching. This conventional technique allows a high speed etching process with preventing the gate electrode from being charged.

The conventional technique described above takes the measure to the plasma damage in the process of layout design. If the interconnection comprises laminations of the three layers, then the total sum of the individual antenna ratios of the individual three layers is calculated, so that the total sum is considered to be the antenna ratio of the interconnection. The individual antenna ratios are independent from the influence of the inter-layers about the plasma damage. For which reason, the plasma damage is not accurately represented by the total sum of the antenna ratios.

For the processes for forming the through hole and the interconnection, the through hole and the interconnection are different in shape, plasma density, and charge-up mechanism. This means that the maximum antenna ratio and the definition of the antenna ratio are different. Accordingly, it seems no sense to simply sum the individual antenna ratios. Even if the individual antenna ratios are simply summed, it seems difficult to accurately estimate the degree oft he plasma damage.

Consequently, in accordance with the conventional layout design method, in case, it not necessarily difficult to accurately estimate the degree of the plasma damage based upon the antenna ratio. The availability of the layout deign in consideration of the degree of the plasma damage is limited.

Meanwhile, the other conventional technique is to take the measure to the plasma damage in the manufacturing processes. This conventional technique increases the manufacturing processes and needs a complicated manufacturing apparatus.

For example, in accordance with the above described conventional technique disclosed in Japanese laid-open patent publication No. 10-247638, the processes for forming the insulation film over the gate oxide film and removal of the insulation film are additionally necessary, thereby increasing the number of the fabrication processes. The side portions of the gate electrode are not covered by the insulation film, for which reason the gate electrode is charged-up by the plasma, whereby the gate insulation film receives the plasma damage.

In accordance with the above described conventional technique disclosed in Japanese laid-open patent publication No. 10-144658, a high frequency voltage generator is additionally necessary for periodically and positively bias the substrate. This means that the manufacturing apparatus is complicated. It is difficult to prevent the gate electrode from being charged up and also prevents the gate oxide film from the plasma damage.

In accordance with the above described conventional technique disclosed in Japanese laid-open patent publication No. 5-308055, the etching processes comprise two processes of the magnetic field applied high density plasma etching process and the magnetic field free high density plasma etching process. In the magnetic field free high density plasma etching process, the etching rate is reduced, whereby the throughput is reduced. In addition, even no magnetic field is applied, then it is difficult to prevent the plasma damage. Other factors than the magnetic field cause the plasma non-uniform which may provides the plasma damage.

In the above circumstances, it had been required to develop a novel method and system for layout design of semiconductor devices free from the above problem.

SUMMARY OF THE INVENTION

Accordingly, it is an object of the present invention to provide a novel method for layout design of semiconductor devices free from the above problems.

It is a further object of the present invention to provide a novel method for layout design of semiconductor devices with an accurate estimation on degree of plasma damage to the gate insulation film in plural processes without, however, increasing the manufacturing processes.

It is a still further object of the present invention to provide a novel system for layout design of semiconductor devices with an accurate estimation on degree of plasma damage to the gate insulation film in plural processes without, however, making the manufacturing apparatus complicated.

It is yet a further object of the present invention to provide a novel storage medium which stores a computer program for layout design of semiconductor devices which an accurate estimation on degree of plasma damage to the gate insulation film in plural processes.

The present invention provides a system for estimating a plasma damage for subsequent layout design of a semiconductor device. The system comprises: an antenna ratio extraction unit for extracting an antenna ratio from each of existing provisional layout patterns to be exposed to plasma in each of plasma processes; an index calculation unit connected to the antenna ratio extraction unit for receiving the antenna ratio extracted by the antenna ratio extraction unit and calculating an individual damage index representing a degree of a plasma damage in accordance with the antenna ratio; and an index addition unit damage in accordance calculation unit for receiving the individual damage indexes from the index calculation unit and adding the individual damage indexes to estimate a plasma damage.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

Figure 1:
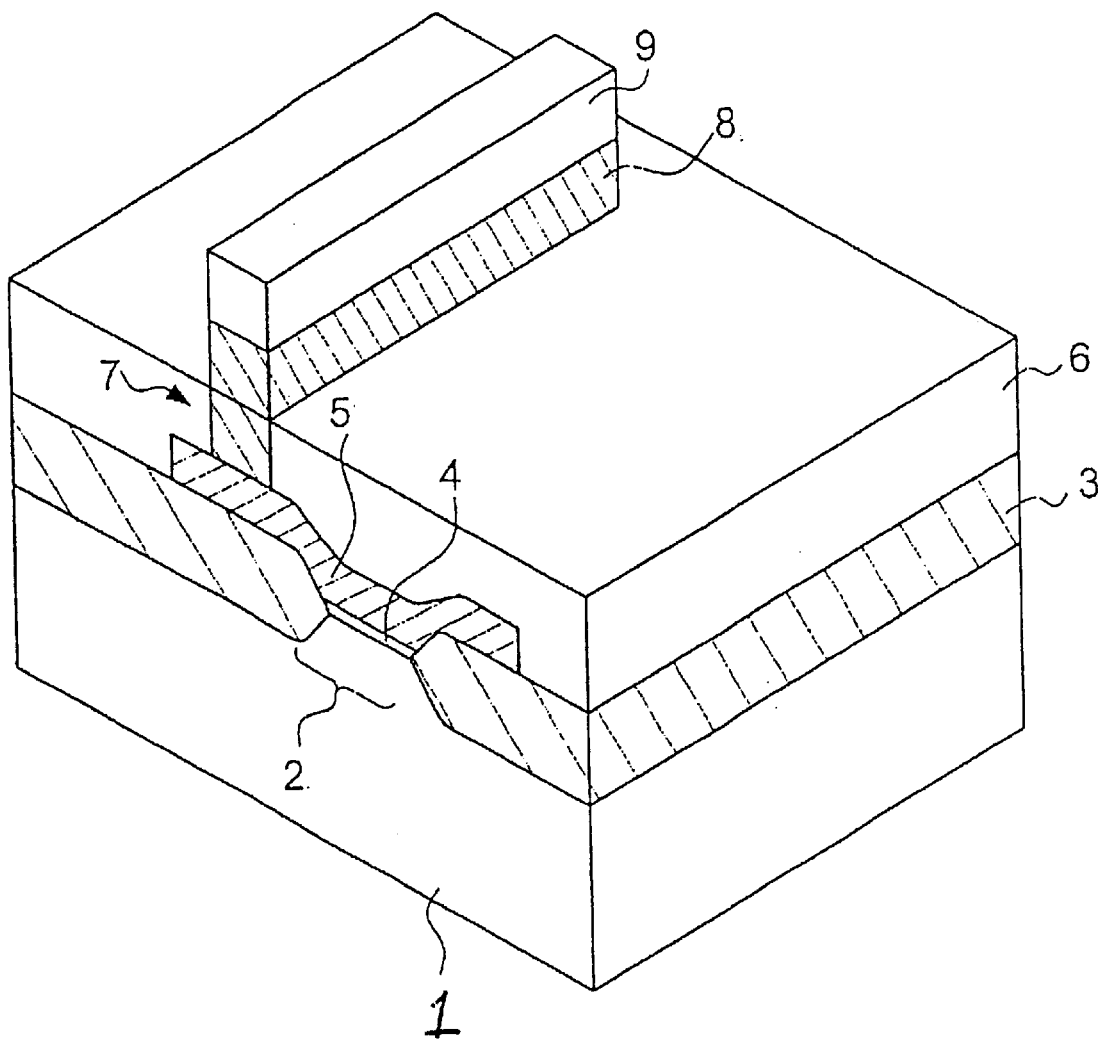
FIG. 1 is a fragmentary schematic perspective view illustrative of a semiconductor device to explain a mechanism of causing the plasma damage to the gate insulation film.

The first present invention provides a system for estimating a plasma damage for subsequent layout design of a semiconductor device. The system comprises: an antenna ratio extraction unit for extracting an antenna ratio from each of existing provisional layout patterns to be exposed to plasma in each of plasma processes; an index calculation unit connected to the antenna ratio extraction unit for receiving the antenna ratio extracted by the antenna ratio extraction unit and calculating an individual damage index representing a degree of a plasma damage in accordance with the antenna ratio; and an index addition unit connected to the index calculation unit for receiving the individual damage indexes from the index calculation unit and adding the individual damage indexes to estimate a plasma damage.

It is preferable that the index addition unit receives all of the individual damage indexes from the index calculation unit before adding all of the individual damage indexes.

It is also preferable that the index addition unit sequentially adds each of the individual damage indexes just after received the same from the index calculation unit.

It is also preferable that the index calculation unit calculates the degree of the plasma damage from the antenna ratio extracted on the basis of a predetermined relationship between the degree of the plasma damage and the antenna ratio in each of the plasma processes.

It is further preferable that the index calculation unit calculates the degree of the plasma damage on the basis of $Di=(Ri/Rmax.i)^{ai}$, where "Di" is the degree of the plasma damage defined in a plasma process "i", "Ri" is the antenna ratio defined in the plasma process "i", "Rmax.i" is the maximum value of the acceptable range of the antenna ratio defined in the plasma process "i", "ai" ($0 \leq$ "ai" $\leq 1$) is the fitting coefficient defined in the plasma process "i".

It is preferable to further comprise a layout varying unit connected to the index addition unit for receiving the total damage index from the index addition unit and executing a change to the layout design in accordance with the total damage index.

It is further preferable that the layout varying unit changes the layout so that the layout pattern of the conductive layer connected to the gate electrode is divided into plural parts so that an antenna size to the gate electrode is reduced to reduce the degree of the plasma damage.

It is also preferable that the layout varying unit changes the layout so that a current leak path is formed between the conductive layer connected to the gate electrode and the semiconductor substrate to reduce the degree of the plasma damage without dividing the conductive layer.

It is preferable to further comprise an index coefficient setting unit connected to the index calculation unit for setting an individual index coefficient for allowing the index calculation unit to calculate the individual index by use of the individual index coefficient.

The second present invention provides a method for estimating a plasma damage for subsequent layout design of a semiconductor device. The method comprises the steps of: extracting an antenna ratio from each of existing provisional layout patterns to be exposed to plasma in each of plasma processes; calculating an individual damage index representing a degree of a plasma damage in accordance with the antenna ratio; and adding the individual damage indexes to estimate a plasma damage.

It is preferable that all of the individual damage indexes are added one time.

It is also preferable that the individual damage indexes are sequentially added just after each of the individual damage indexes are calculated.

It is also preferable that the degree of the plasma damage is calculated from the antenna ratio extracted on the basis of a predetermined relationship between the degree of the plasma damage and the antenna ratio in each of the plasma processes.

It is further preferable that the degree of the plasma damage is calculated on the basis of $Di=(Ri/Rmax.i)^{ai}$, where "Di" is the degree of the plasma damage defined in a plasma process "i", "Ri" is the antenna ratio defined in the plasma process "i", "Rmax.i" is the maximum value of the acceptable range of the antenna ratio defined in the plasma process "i", "ai" ($0 \leq$ "ai" $\leq 1$) is the fitting coefficient defined in the plasma process "i".

It is preferable to further comprise the step of executing a change to the layout design in accordance with the total damage index.

It is also preferably that the layout is changed so that the layout pattern of the conductive layer connected to a gate electrode is divided into plural parts so that an antenna size to the gate electrode is reduced to reduce the degree of the plasma damage.

It is also preferable that the layout is changed so that a current leak path is formed between the conductive layer connected to a gate electrode and a semiconductor substrate to reduce the degree of the plasma damage without dividing the conductive layer.

It is preferable to further comprise the step of setting an individual index coefficient for allowing calculation of the individual index by use of the individual index coefficient.

The third present invention provides a storage medium storing a computer program executing a process for estimating a plasma damage for subsequent layout design of a semiconductor device, wherein said process is defined in the above second present invention.

The plasma damage is caused by the accumulation of the damage in the gate oxide film in the individual plasma processes. Namely, the plasma damage is estimated on the basis of the total sum of the individual plasma damages in the individual plasma processes.

In accordance with the present invention, the shape and the plasma density as well as the charge-up mechanism are different for every plasma processes. It is further difficult to make a uniform definition of the antenna ratio. An individual relationship between the degree of the plasma damage and the antenna ratio is experimentally pre-determined for each of the layout-out layer and each of the plasma processes. These individual relationships are used to calculate the degrees of the individual plasma damage based on the antenna ratios. The degrees of the individual plasma damages are summed for all of the laying-out layers formed by the plasma processes to calculate the total degree of the plasma damage. The layout design is carried out based on the total degree of the plasma damage.

The relationship between the plasma damage and the antenna ratio is experimentally determined by measuring a charge quantity Qbd which is a critical quantity of charges breaking the gate insulation film upon flowing through the gate insulation film. The measurement to the charge quantity Qbd is measured in the uniform standard for all of the plasma processes. The relationship between the degree of the plasma damage and the antenna ratio is represented by an exponential function ($X^a$). A fitting coefficient (ai) is appropriately set to an exponential part of the exponential function to approach the calculated value to the measured value.

The individual correspondent relationships between the degrees of the plasma damage and the antenna ratios are previously determined for all of the layout-out layer patterned by the plasma processes. The antenna ratios may be defined for every layout patterns. Even if the relationships between the degrees of the plasma damage and the antenna ratios are different among the individual layers, it is possible to calculate the individual degrees of the plasma damages based upon the antenna ratios in each of the layers and in each of the plasma processes. It is possible to execute the layout design together with evaluating the individual degrees of the plasma damages in all of the plasma processes of the layout design step.

The antenna ratios are extracted from the layout patterns exposed to the plasma processes. The degrees of the plasma damages are calculated in accordance with the antenna ratios. All of the calculated degrees of the plasma damages are added for all of the plasma processes. The layout is changed in accordance with the result of the addition of the degrees of the plasma damages. It is possible to accurately estimate the degree of the plasma damage in plural plasma processes for subsequently carrying out an appropriate layout design without increasing the number of manufacturing processes and making the manufacturing system complicated.

On the basis of the correspondent relationship between the degree of the plasma damage and the antenna ratio in each of the plasma processes, the degree of the plasma damage is calculated from the antenna ratio extracted for each of the plasma processes, so that the degrees of the plasma damages corresponding to the individual antenna ratios are calculated in each of the plasma processes.

Further, the degree "Di" of the plasma damage is defined in the plasma process "i". The antenna ratio "Ri" is defined in the plasma process "i". The maximum value "Rmax.i" of the acceptable range of the antenna ratio is defined in the plasma process "i". The fitting coefficient "ai" ($0 \leq$ "ai" $\leq 1$) is defined in the plasma process "i". The degree "Di" of the plasma damage is calculated by $Di=(Ri/Rmax.i)^{ai}$. The degree of the plasma damage is calculated on the basis of the predetermined relationship.

The layout is changed so that the layout pattern of the conductive layer connected to the gate electrode is divided into plural parts so that an antenna size to the gate electrode is reduced to reduce the degree of the plasma damage.

The layout is also changed so that a current leak path is formed between the conductive layer connected to the gate electrode and the semiconductor substrate to reduce the degree of the plasma damage without dividing the conductive layer.

In accordance with the present invention, the degree of the plasma damage is accurately estimated in the step of design. It is possible to prevent any unnecessary change to the layout design and also to prevent any unnecessary increase in the area of the layout.

The following descriptions are concerned with the layout design system, wherein degrees of the individual plasma damage are estimated for all of previously and provisionally designed layout patterns for subsequent actual layout design in accordance with the result of the estimation.

PREFERRED EMBODIMENT

Figure 2:
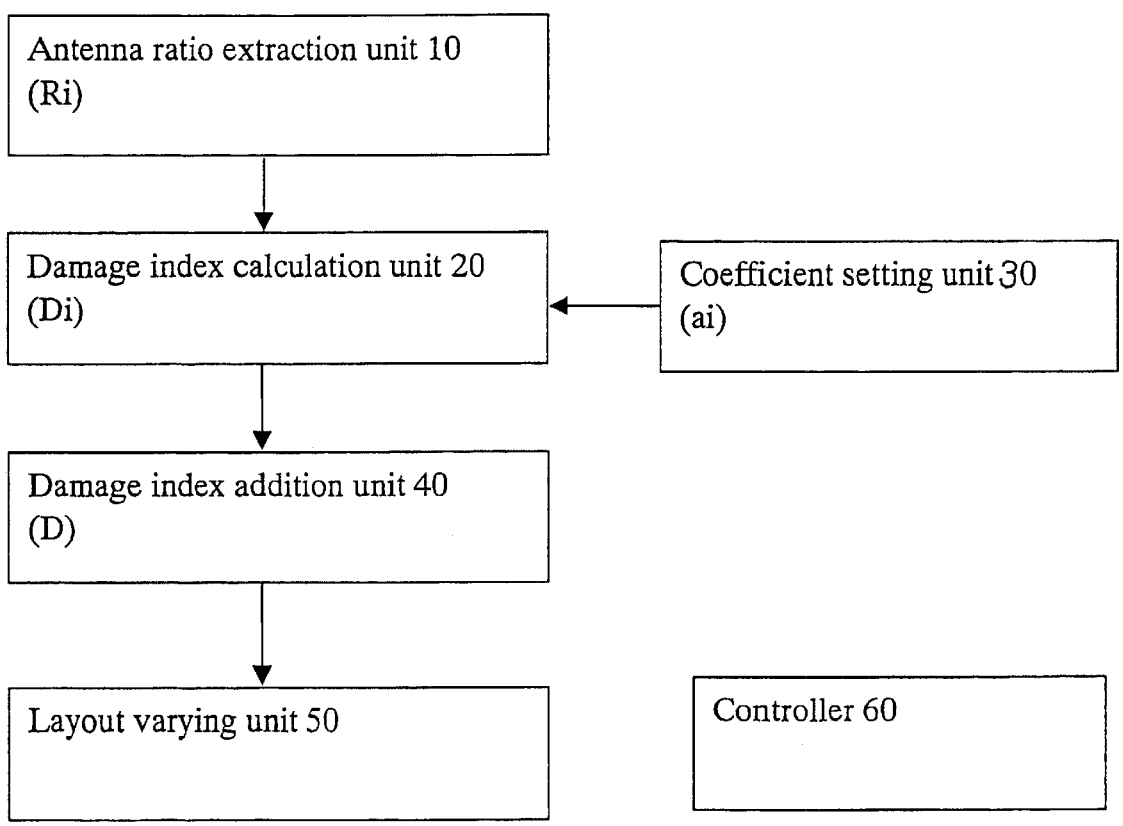
FIG. 2 is a block diagram illustrative of a novel layout design system in a first embodiment in accordance with the present invention.

A first embodiment according to the present invention will be described in detail with reference to the drawings. FIG. 2 is a block diagram illustrative of a novel layout design system in a first embodiment in accordance with the present invention. The novel layout design system has an antenna ratio extraction unit 10, an index calculation unit 20, an index coefficient setting unit 30, an index addition unit 40, a layout varying unit 50 and a controller 60. The antenna ratio extraction unit 10 extracts an antenna ratio from each of existing provisional layout patterns to be exposed to plasma in each of plasma processes. The index calculation unit 20 is connected to the antenna ratio extraction unit 10 for receiving the antenna ratio extracted by the antenna ratio extraction unit 10 and calculating an index Di representing a degree of the plasma damage in accordance with the antenna ratio. The index coefficient setting unit 30 is connected to the index calculation unit 20 for setting the index coefficient ai for allowing the index calculations unit 20 to calculate the index Di by use of the index coefficient ai. The index addition unit 40 is connected to the index calculation unit 20 for receiving the indexes Di from the index calculation unit 20 and adding the indexes Di for all of the plasma processes. The layout varying unit 50 is connected to the index addition unit 40 for receiving a result of additions of the indexes Di from the index addition unit 40 and executing, if necessary, change to the layout design in accordance with the result of the additions of the indexes Di. The controller 60 is connected to the antenna ratio extraction unit 10, the index calculation unit 20, the index coefficient setting unit 30, the index addition unit 40, and the layout varying unit 50 for controlling the antenna ratio extraction unit 10, the index calculation unit 20, the index coefficient setting unit 30, the index addition unit 40, and the layout varying unit 50.

The above units are configured on the computer and the functions of the above units are described on the software of the computer. The above units may also configured on the hardware.

Figure 3:
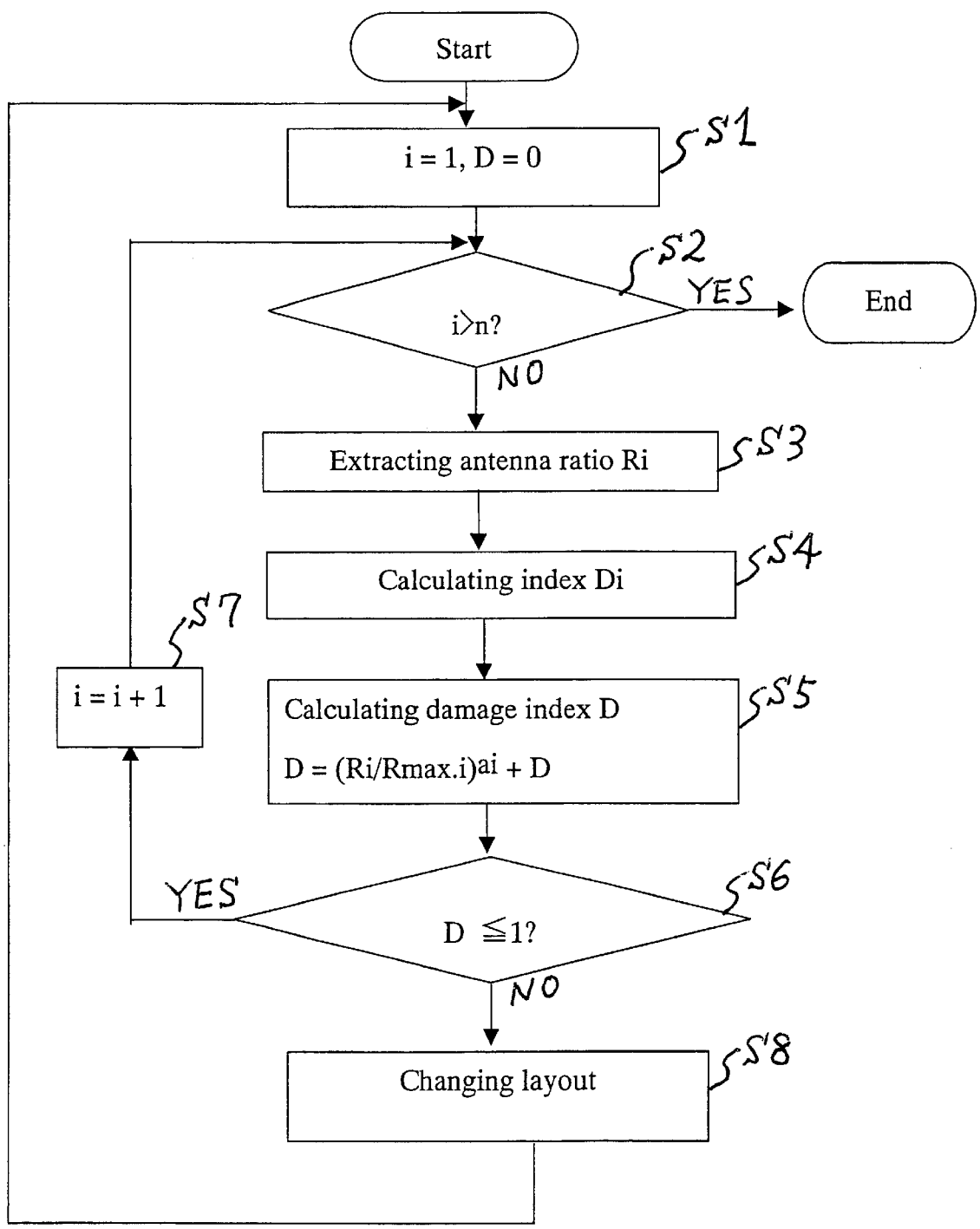
FIG. 3 is a flow chart illustrative of a method of layout design by the novel layout design system of FIG. 2.
Figure 4A:
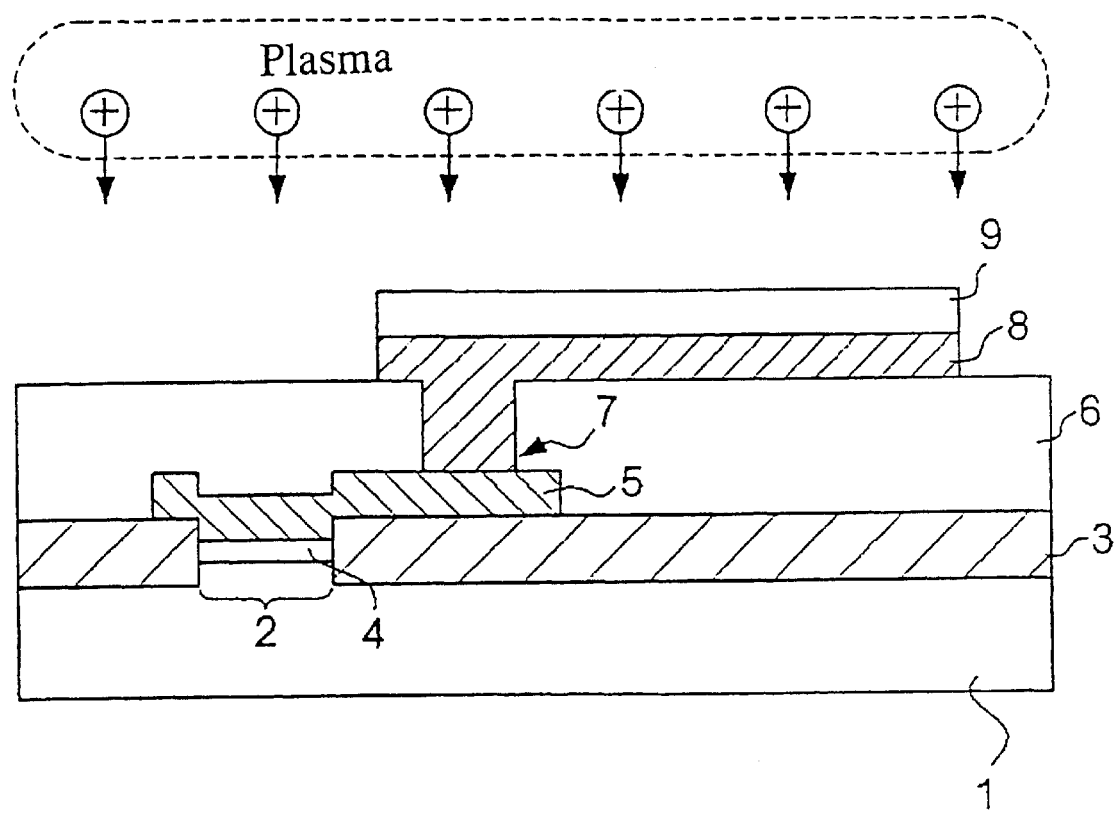
FIG. 4A is a fragmentary schematic cross sectional elevation view illustrative of a semiconductor device for which the novel layout design system of FIG. 2 executes the layout design in accordance with the method of FIG. 3.
Figure 4B:
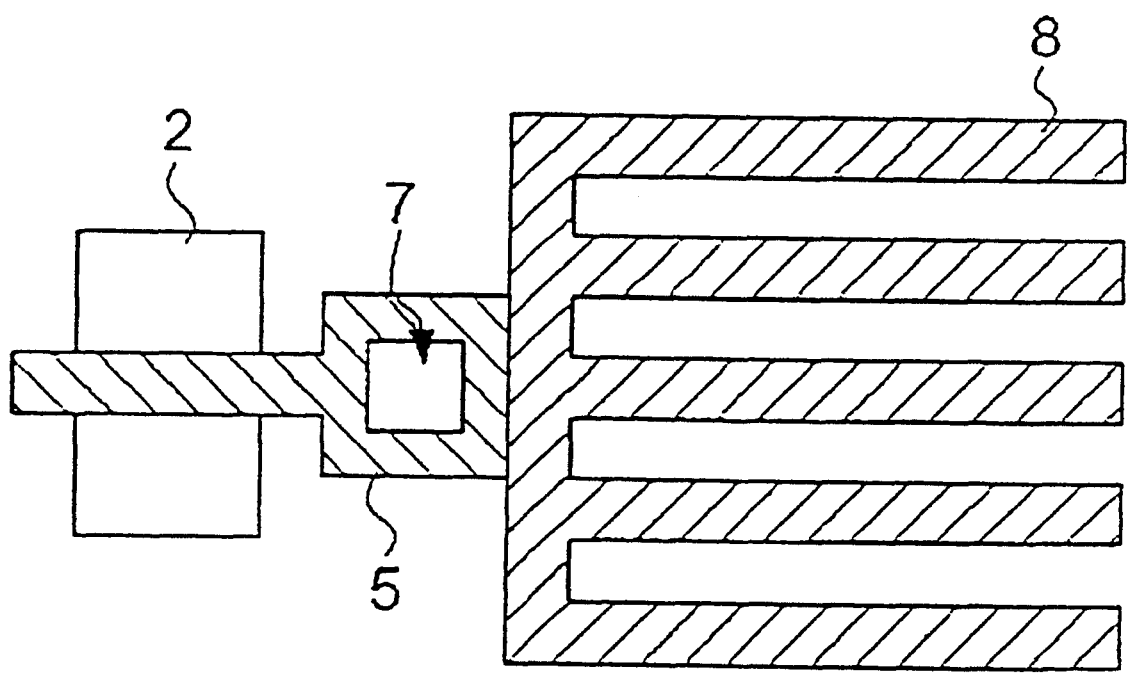
FIG. 4B is a fragmentary plan view illustrative of the layout pattern of the semiconductor device of FIG. 4A.

FIG. 3 is a flow chart illustrative of a method of layout design by the novel layout design system of FIG. 2. FIG. 4A is a fragmentary schematic cross sectional elevation view illustrative of a semiconductor device for which the novel layout design system of FIG. 2 executes the layout design in accordance with the method of FIG. 3. FIG. 4B is a fragmentary plan view illustrative of the layout pattern of the semiconductor device of FIG. 4A.

With reference to FIG. 4A, field oxide films 3 are selectively formed on a surface of a semiconductor substrate 1 so that an active region 2 is defined by the field oxide films 3. A gate oxide film 4 is formed on the active region 2 of the semiconductor substrate 1. A gate electrode 5 is formed, which extends over the gate oxide film 4 and parts of the field oxide films 3. An inter-layer insulator 6 is entirely formed over the gate electrode 5 and the field oxide film 3. A through hole 7 is formed in the inter-layer insulator 6 and over the gate electrode 5, so that the through hole 7 reaches a part of the top surface of the gate electrode 5.

An aluminum layer is entirely deposited over the inter-layer insulator 6 and also within the through hole 7, so that the aluminum layer within the through hole 7 is in contact with the part of the top surface of the gate electrode 5. A resist is entirely applied on the aluminum layer and then baked. The resist is patterned by a lithography technique to form a resist pattern 9 on the aluminum layer. A plasma etching to the aluminum layer is then carried out by use of the resist pattern 9 as a mask to form an aluminum interconnection 8.

Before the plasma etching process is carried out, the known layout design tool is used without consideration of the plasma damage to execute the provisional layout design as shown in FIG. 4B.

With reference to FIG. 3, operations of the novel system will be described.

In a step S1, the controller 60 sets an initial value to a variable "i" representing a layer attracted as an object to be processed by the novel system and also sets an initial value to a damage index "D" representing the degree of the plasma damage over all of the layers. For example, the initial value 1 is set to the variable "i", whilst the initial value 0 is set to the damage index "D".

In a step S2, the controller 60 judges whether or not the variable "i" exceeds over a predetermined value "n" which represents the number of layers to be processed in the plasma processes. In this embodiment, 2 is set to the predetermine value "n". The variable "i" given to the final layer to be processed in the final plasma process is externally set as the predetermine value "n". The initial value of the variable "i" has now been set to be 1. The variable "i" is smaller than 2 as the predetermine value "n". The controller 60 judges that the variable "i" does not exceed over a predetermined value "n". In this case, the process enters into a step S3.

In the step S3, the controller 60 activates the antenna ratio extraction unit 10 so that the antenna ratio extraction unit 10 extracts the antenna ratio "Ri" of the layer designated by the variable "i". For example, the antenna ratio "Ri" is calculated from a pattern of the through hole. Only a bottom of the through hole serves as an antenna, for which reason the area of the bottom of the through hole is divided by the area of the gate oxide film to calculate the antenna ratio "Ri".

In a step S4, the controller 60 activates the index calculation unit 20 so that the index calculation 20 calculates the index "Di" representing the degree of the plasma damage to the subjected layer designated by the variable "i" in accordance with the following equation.

$$Di=(Ri/Rmax.i)^{ai}$$

where Ri is the antenna ratio of the subjected layer designated by the variable "i" and is calculated from the provisionally design layout pattern, and Rmax.i is the maximum value of the acceptable range of the antenna ratio of the subjected layer designated by the variable "i" and is previously and experimentally found by measuring a withstand voltage and a leakage of current of the gate oxide film. The exponential character "ai" is the fitting coefficient ($0 \leq$ "ai"$\leq 1$) set to the subjected layer designated by the variable "i" and experimentally found to take a match between the degree of the plasma damage and the antenna ratio. The above Ri/Rmax.i will hereinafter be referred to as an antenna index "Xi".

Figure 5:
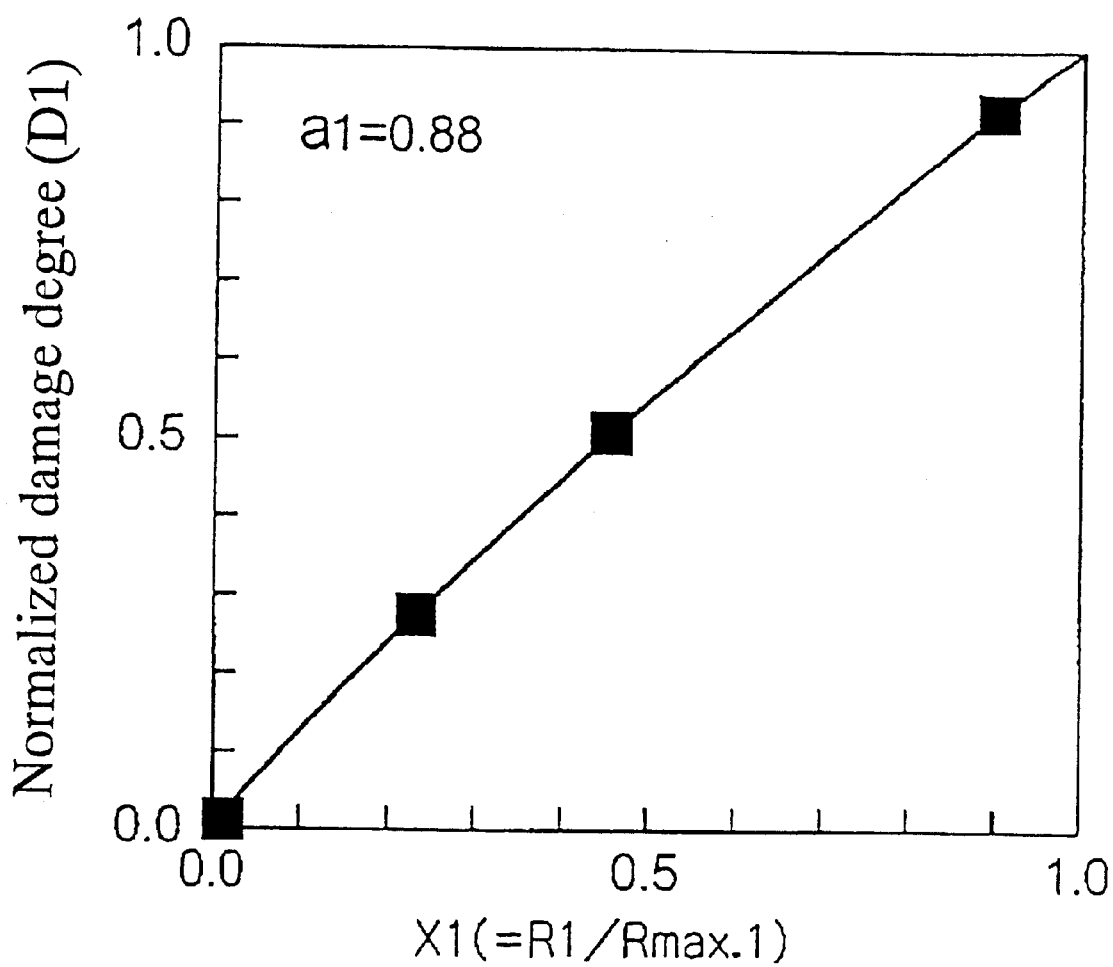
FIG. 5 is a diagram illustrative of variations in normalized degree of plasma degree over the antenna index "Xi" (Ri/Rmax.i).

FIG. 5 is a diagram illustrative of variations in normalized degree of plasma damage over the antenna index "Xi" (Ri/Rmax.i). The fitting coefficient "ai" is set to be 0.88. If the antenna index "Xi" is 1 or the antenna ratio Ri is made equal to the maximum antenna ratio Rmax.i, then the degree Di of the plasma damage is made into 1 and reaches the maximum value.

In a step S5, the controller 60 activates the index addition unit 40 so that the index addition unit 40 adds the calculated index Di of the subjected layer designated by the variable "i" to the damage index "D". The layer in the through hole is the first-processing layer, for which reason the damage index "D" after added with the index "Di" is just the index D1 calculated for the layer in the through hole.

In a step S6, the controller 60 judges whether or not the damage index "D" exceeds 1. If the damage index "D" does not exceed 1 or the degree of the damage does not reach the upper limit, the process will enter into a step S7.

In a step S7, the controller 60 increments the variable "i" with 1 to obtain 2 as the variable "i". Subsequently, the process will return to the above step S2.

In the step S2, the controller 60 judges whether or not the variable "i" (=2) exceeds over the predetermined value "n" (=2). The variable "i" does not exceed 2 as the predetermine value "n". The controller 60 judges that the variable "i" does not exceed over a predetermined value "n". In this case, the process enters into the step S3.

In the step S3, the controller 60 activates the antenna ratio extraction unit 10 so that the antenna ratio extraction unit 10 extracts the antenna ratio "R2" of the layer designated by the variable "2". For example, the antenna ratio "R2" is calculated from a pattern of the through hole. Only a bottom of the through hole serves as an antenna, for which reason the area of the bottom of the through hole is divided by the area of the gate oxide film to calculate the antenna ratio "R2".

In the step S4, the controller 60 activates the index calculation unit 20 so that the index calculation unit 20 calculates the index "D2" representing the degree of the plasma damage to the subjected layer designated by the variable "2" in accordance with the above equation.

Figure 6:
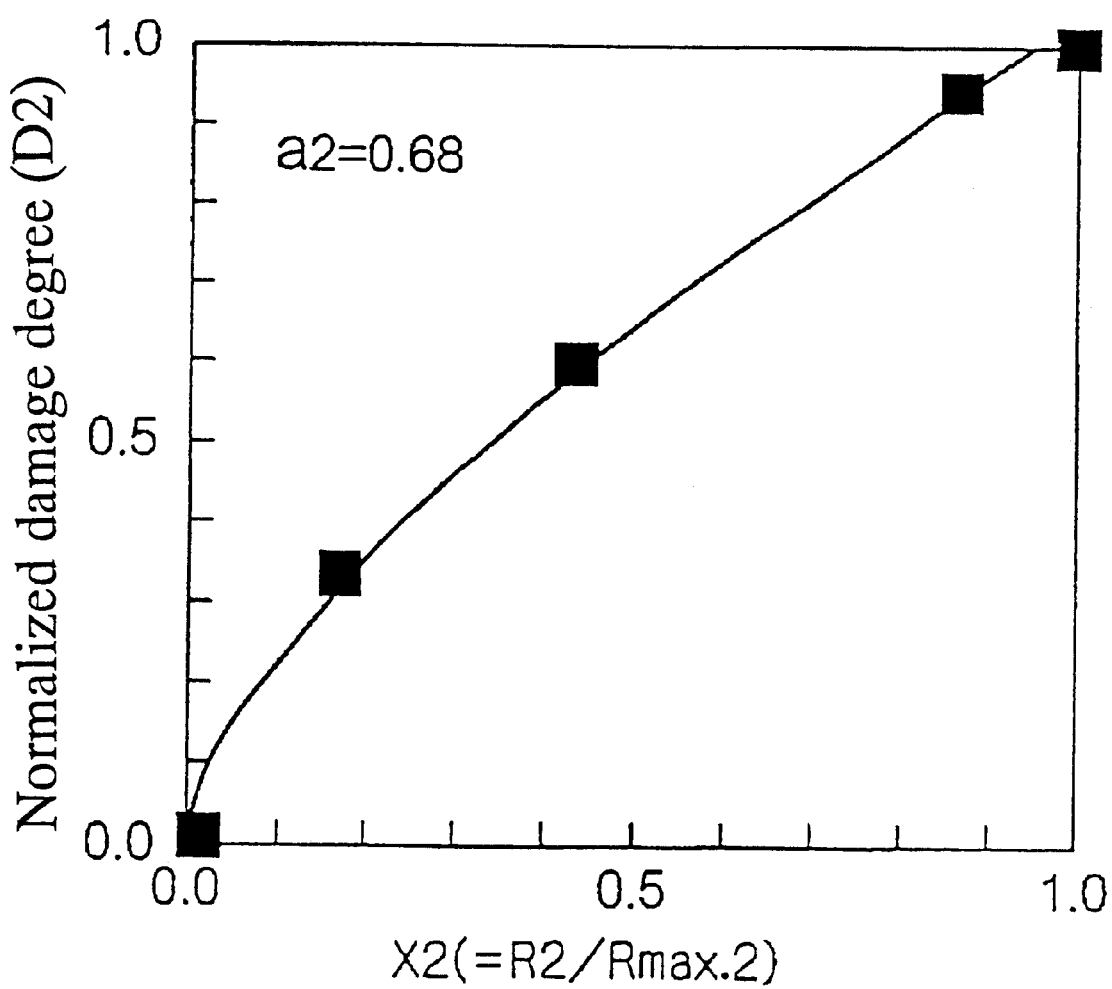
FIG. 6 is a diagram illustrative of variations in normalized degree of plasma damage over the antenna index "Xi" (Ri/Rmax.i).

FIG. 6 is a diagram illustrative of variations in normalized degree of plasma damage over the antenna index "Xi" (Ri/Rmax.i). The fitting coefficient "a2" is set to be 0.68. If the antenna index "X2" is 1 or the antenna ratio R2 is made equal to the maximum antenna ratio Rmax.2, then the degree D2 of the plasma damage is made into 1 and reaches the maximum value.

In the step S5, the controller 60 activates the index addition unit 40 so that the index addition unit 40 adds the calculated index D2 of the subjected layer designated by the variable "2" to the damage index "D".

The antenna ratio R2 of the layer designated by the variable "1" in the through hole is different in definition from the antenna ratio R2 of the layer extending over the inter-layer insulator. The individual degrees of the plasma damages in accordance with the individual antenna ratios defined for the individual layers within the through hole and over the inter-layer insulator are calculated from the previously given relationships between the degree of the plasma damage and the antenna ratio. The relationships are given by the above equation which could be obtained experimentally. Once the equation representing the relationship between the degree of the plasma damage and the antenna ratio has been given, the degrees of the plasma damages is definitely calculated from the antenna ratios variously defined.

In the step S6, the controller 60 judges whether or not the damage index "D" exceeds 1. If the damage index "D" exceeds 1 or the degree of the damage exceeds the upper limit, the process will enter into a step S8.

In a step S8, the controller 60 activates the layout varying unit 50 to change the layout design.

Figure 7:
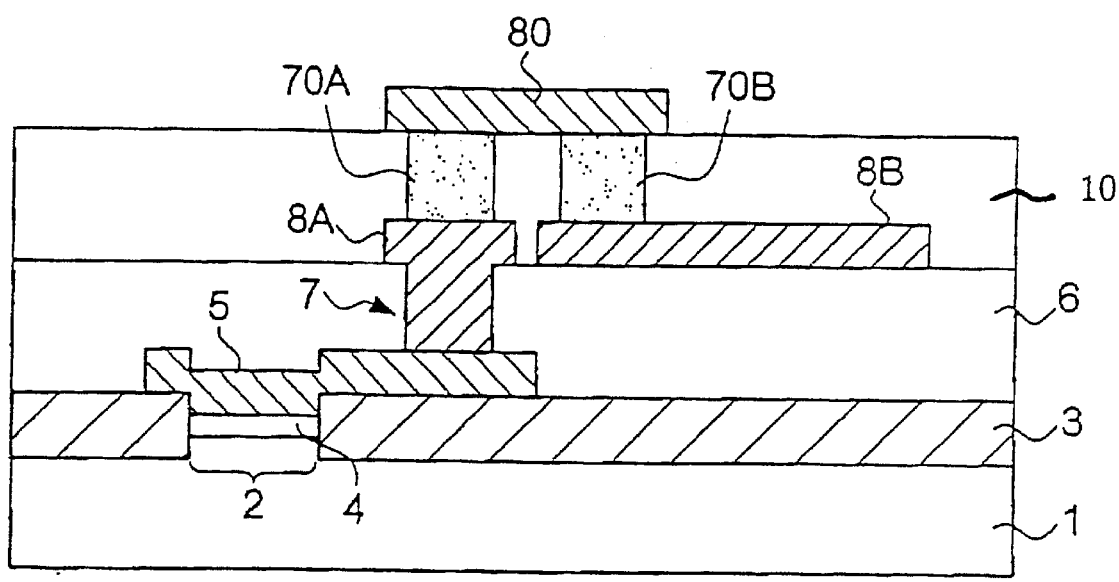
FIG. 7 is a fragmentary cross sectional elevation view illustrative of a semiconductor device after a layout has been changed from what is shown in FIG. 4A by the novel system of FIG. 2 in accordance with the method of FIG. 3.

FIG. 7 is a fragmentary cross sectional elevation view illustrative of a semiconductor device after a layout has been changed from what is shown in FIG. 4A by the novel system of FIG. 2 in accordance with the method of FIG. 3. The semiconductor substrate 1, the active region 2, the field oxide film 3, the gate oxide film 4, the gate electrode 5, the first inter-layer insulator 6 and the through hole 7 are unchanged from what is shown in FIG. 4A, whilst the aluminum interconnection layer 8 is divided into a first interconnection layer 8A and a second interconnection layer 8B which are smaller in the length of the circumference thereof. A second inter-layer insulator 10 is further formed over the first and second interconnection layers 8A and 8B and the first inter-layer insulator 6. First and second through holes 70A and 70B are formed in the second inter-layer insulator 10, so that the first and second through holes 70A and 70B reach top surfaces of the first and second interconnection layers 8A and 8B. A second level inter-layer insulator 80 is formed on the second inter-layer insulator 10 so that the second level inter-layer insulator 80 is connected through the first and second through holes 70A and 70B to the first and second interconnection layers 8A and 8B. In this case, the first interconnection layer 8A and the second level inter-layer insulator 80, both of which are smaller in length of the circumference, serve as the antenna, whereby the total antenna ratio is reduced and the damage index "D" is also reduced.

In this example, the layout is changed so that the aluminum interconnection layer is divided to reduce the total antenna ratio. It is, however, possible to change the layout of the interconnection layer as follows.

Figure 8:
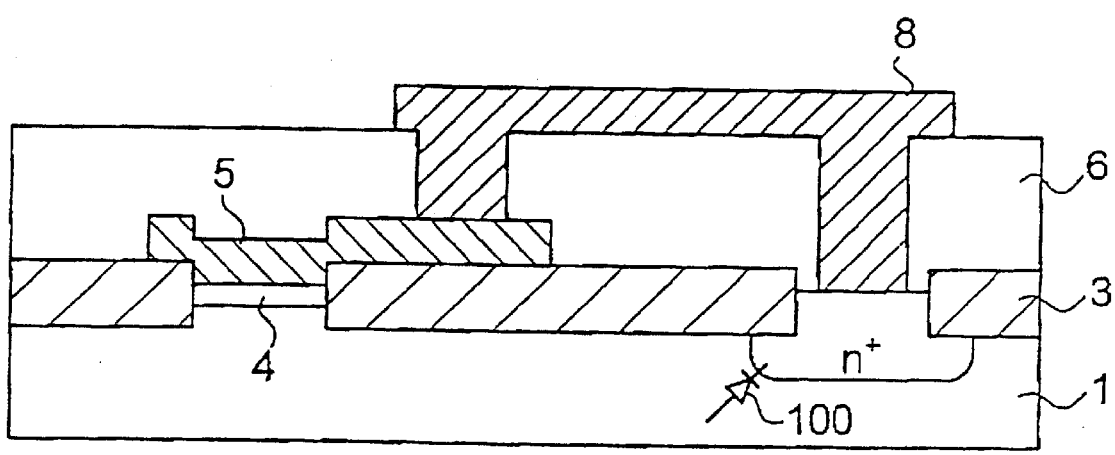
FIG. 8 is a fragmentary cross sectional elevation view illustrative of a semiconductor device after a layout has been changed from what is shown in FIG. 4A by the novel system of FIG. 2 in accordance with the method of FIG. 3.

FIG. 8 is a fragmentary cross sectional elevation view illustrative of a semiconductor device after a layout has been changed from what is shown in FIG. 4A by the novel system of FIG. 2 in accordance with the method of FIG. 3. The semiconductor substrate 1, the active region 2, the field oxide film 3, the gate oxide film 4, the gate electrode 5, the first inter-layer insulator 6 and the through hole 7 are unchanged from what is shown in FIG. 4A, whilst the aluminum interconnection layer 8 is connected to a diode 100 formed between an n+-well region and the p-type semiconductor substrate 1. Namely, the aluminum interconnection layer 8 extends over the inter-layer insulator and also extends within another through hole to each the n+-well region of the diode 100, so that the charges of the charge particles of the plasma are emitted as a diode current in the reverse direction.

It is also possible to change the layout of the through holes in addition to the interconnection layer. In this case, the number of the through holes is reduced and the size of the through holes is reduced. The antenna ratio is mostly dominated by the plasma process for forming the interconnections rather than the plasma process for forming the through holes, for which reason it is more effective for improving the damage index D to change the layout of the interconnection rather than the layout of the through holes.

The controller 60 repeats the above sequential processes until the variable "i" exceeds the predetermined number "n". After the above process for changing the layout has been completed, then the variable "i" is incremented to 3. In the step S2, the variable "i" exceeds the predetermined number "n", then the above sequential processes are completed.

It is also possible to increment the predetermined number "n" by the number of newly added layers in the processes for changing the layout, so that all of the layers including the newly added layers in the processes for changing the layout are subjected to the estimations.

The above novel layout design apparatus in accordance with the present invention executes the layout design so as to suppress the degree of the plasma damages throughout all of the plasma processes.

In the above embodiment, just after the individual damage index Di is calculated, subsequently the individual damage index Di is sequentially added to the damage index D. It is also possible that after all of the individual damage indexes Di are calculated, before the all of the individual damage indexes Di are added to the damage index D.

In this case, the damage index D is calculated by the following equation.

$$D=D1+D2+D3+\ldots+Dn = (R1/Rmax.1)^{a1}+(R2/Rmax.2)^{a2}\ldots+(Rn/Rmax.n)^{an}.$$

where n is the number of the layers to be processed by the plasma processes.

In the above embodiment, the damage index D is calculated before the process for changing the layout is executed in accordance with the calculated damage index D. It is also possible to eliminate the process for changing the layout so that the system is to simply output the damage index D for allowing the system to serve as a design rule checker.

In the above embodiment, the relationship between the degree of the plasma damage and the antenna ratio is represented by the exponential function. Other functions than the exponential function are also available. It is possible that any necessary fitting coefficient is optionally introduced, wherein the value of the fitting coefficient may be determined by experimentally measuring the quantity which contributes the plasma damage such as the quantity of charge.

In the above embodiment, the antenna ratio Ri is normalized by the maximum antenna ratio Rmax.i, and the relationship between the damage index Di and the antenna ratio Ri is defined by the exponential function. It is also possible that the antenna ratio Ri is not normalized, and the relationship between the damage index Di and the antenna ratio Ri is defined by other functions than the exponential function.

In accordance with the present invention, the following effects are obtained.

The antenna ratios are extracted from the layout patterns exposed to the plasma processes. The degrees of the plasma damages are calculated in accordance with the antenna ratios. All of the calculated degrees of the plasma damages are added for all of the plasma processes. The layout is changed in accordance with the result of the addition of the degrees of the plasma damages. It is possible to accurately estimate the degree of the plasma damage in plural plasma processes for subsequently carrying out an appropriate layout design without increasing the number of manufacturing processes and making the manufacturing system complicated.

On the basis of the correspondent relationship between the degree of the plasma damage and the antenna ratio in each of the plasma processes, the degree of the plasma damage is calculated from the antenna ratio extracted for each of the plasma processes, so that the degree of the plasma damages corresponding to the individual antenna ratios are calculated in each of the plasma processes.

Further, the degree "Di" of the plasma damage is defined in the plasma process "i". The antenna ratio "Ri" is defined in the plasma process "i". The maximum value "Rmax.i" of the acceptable range of the antenna ratio is defined in the plasma process "i". The fitting coefficient "ai" ($0 \leq$ "ai" $\leq 1$) is defined in the plasma process "i". The degree "Di" of the plasma damage is calculated by $Di=(Ri/Rmax.i)^{ai}$. The degree of the plasma damage is calculated on the basis of the predetermined relationship.

The layout is changed so that the layout pattern of the conductive layer connected to the gate electrode is divided into plural parts so that an antenna size to the gate electrode is reduced to reduce the degree of the plasma damage.

The layout is also changed so that a current leak path is formed between the conductive layer connected to the gate electrode and the semiconductor substrate to reduce the degree of the plasma damage without dividing the conductive layer.

In accordance with the present invention, the degree of the plasma damage is accurately estimated in the step of design. It is possible to prevent any unnecessary change to the layout design and also to prevent any unnecessary increase in the area of the layout.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A system for estimating a plasma damage for subsequent layout design of a semiconductor device, comprising:
    an antenna ratio extraction unit for extracting an antenna ratio from each of existing provisional layout patterns to be exposed to plasma in each of plasma processes;
    an index calculation unit connected to the antenna ratio extraction unit for receiving each antenna ratio extracted by the antenna ratio extraction unit and calculating an individual damage index representing a degree of a plasma damage in accordance with each antenna ratio; and
    an index addition unit connected to the index calculation unit for receiving the individual damage indexes from the index calculation unit and adding the individual damage indexes to estimate a plasma damage,
    wherein the index calculation unit calculates the degree of the plasma damage from the antenna ratio extracted on the basis of a predetermined relationship between the degree of the plasma damage and the antenna ratio in each of the plasma processes.

2. The system as claimed in claim 1, wherein the index addition unit receives all of the individual damage indexes from the index calculation unit before adding all of the individual damage indexes.

3. The system as claimed in claim 1, wherein the index addition unit sequentially adds each of the individual damage indexes just after received the same from the index calculation unit.

4. The system as claimed in claim 1, wherein the index calculation unit calculates the degree of the plasma damage on the basis of $Di=(Ri/Rmax.i)^{ai}$, where "Di" is the degree of the plasma damage defined in a plasma process "i", "Ri" is the antenna ratio defined in the plasma process "i", "Rmax.i" is the maximum value of the acceptable range of the antenna ratio defined in the plasma process "i", "ai" ($0 \leq$ "ai" $\leq 1$) is the fitting coefficient defined in the plasma process "i".

5. The system as claimed in claim 1, further comprising a layout varying unit connected to the index addition unit for receiving the total damage index from the index addition unit and executing a change to the layout design in accordance with the total damage index.

6. The system as claimed in claim 5, wherein the layout varying unit changes the layout so that the layout pattern of the conductive layer connected to the gate electrode is divided into plural parts so that an antenna size to the gate electrode is reduced to reduce the degree of the plasma damage.

7. The system as claimed in claim 5, wherein the layout varying unit changes the layout so that a current leak path is formed between the conductive layer connected to the gate electrode and the semiconductor substrate to reduce the degree of the plasma damage without dividing the conductive layer.

8. The system as claimed in claim 1, further comprising an index coefficient setting unit connected to the index calculation unit for setting an individual index coefficient for allowing the index calculation unit to calculate the individual index by use of the individual index coefficient.

9. A method for estimating a plasma damage for subsequent layout design of a semiconductor device, said method comprising the steps of:

extracting an antenna ratio from each of existing provisional layout patterns to be exposed to plasma in each of plasma processes;

calculating an individual damage index representing a degree of a plasma damage in accordance with the antenna ratio;

adding the individual damage indexes to estimate a plasma damage; and setting an individual index coefficient for allowing calculation of the individual damage index by use of the individual index coefficient.

10. The method as claimed in claim 9, wherein all of the individual damage indexes are added one time.

11. The method as claimed in claim 9, wherein the individual damage indexes are sequentially added just after each of the individual damage indexes are calculated.

12. The method as claimed in claim 9, wherein the degree of the plasma damage is calculated from the antenna ratio extracted on the basis of a predetermined relationship between the degree of the plasma damage and the antenna ratio in each of the plasma processes.

13. The method as claimed in claim 12, wherein the degree of the plasma damage is calculated on the basis of $Di=(Ri/Rmax.i)^{ai}$, where "Di" is the degree of the plasma damage defined in a plasma process "i", "Ri" is the antenna ratio defined in the plasma process "i", "Rmax.i" is the maximum value of the acceptable range of the antenna ratio defined in the plasma process "i", "ai" ($0 \leq$ "ai" $\leq 1$) is the fitting coefficient defined in the plasma process "i".

14. The method as claimed in claim 9, further comprising the step of executing a change to the layout design in accordance with the total damage index.

15. The method as claimed in claim 14, wherein the layout is changed so that the layout pattern of the conductive layer connected to a gate electrode is divided into plural parts so that an antenna size to the gate electrode is reduced to reduce the degree of the plasma damage.

16. The method as claimed in claim 14, wherein the layout is changed so that a current leak path is formed between the conductive layer connected to a gate electrode and a semiconductor substrate to reduce the degree of the plasma damage without dividing the conductive layer.

17. A method for estimating plasma damage for subsequent layout design of a semiconductor device, said method comprising the steps of:

1) determining an amount of layers to be processed in a plasma process;

2) extracting a first antenna ratio from a first layer of the layers;

3) calculating a first individual damage index representing a degree of the plasma damage in accordance with the first antenna ratio;

4) determining whether the first individual damage index exceeds an initial value, if the first individual damage index is less than the initial value and less than a maximum antenna ratio, then 5) extracting a second antenna ratio from at least a second layer of the layers;

6) calculating a second individual damage index representing a degree of the plasma damage in accordance with the second antenna ratio; and 7) adding the first and second individual damage indexes to get a total damage index to estimate a total plasma damage.

18. The method according to claim 17, further comprising the step of executing a change to the layout design based on the total damage index.

19. The method according to claim 17, further comprising the steps of:

determining whether the total damage index exceeds the initial value, if the total damage index is less than the initial value and less than the maximum antenna ration, then repeating additional extracting, calculating and adding steps for each of additional said layers until the total damage index exceeds the initial value and is less than the maximum antenna ratio.

20. A system for estimating a plasma damage for a subsequent layout design for a semiconductor device, comprising:

an antenna ratio extraction unit for extracting an antenna ratio from each layer of an existing provisional layout pattern to be exposed to plasma in each of plural plasma processes;

an index calculation unit connected to the antenna ratio extraction unit for iteratively receiving each antenna ratio extracted by the antenna ratio extraction unit and calculating an individual damage index representing a degree of plasma damage in accordance with each antenna ratio; and an index addition unit connected to the index calculation unit for receiving the individual damage indexes from the index calculation unit and adding the individual damage indexes to estimate a plasma damage.

21. The system according to claim 20, wherein the index addition unit receives all of the individual damage indexes from the index calculation unit before adding the individual damage indexes.

22. The system according to claim 20, wherein the index addition unit sequentially adds each individual damage index immediately after receiving the individual damage indexes from the index calculation unit.

23. The system according to claim 20, further comprising a layout varying unit connected to the index addition unit for receiving a total damage index from the index addition unit and executing a change to the layout design in accordance with the total damage index.

24. The system according to claim 23, wherein the layout varying unit changes the layout so that the layout pattern of a conductive layer connected to a gate electrode is divided into plural parts so that an antenna size of the gate electrode is reduced to reduce the degree of plasma damage.

25. The system according to claim 23, wherein the layout varying unit changes the layout so that a current leak path is formed between the conductive layer connected to a gate electrode and a substrate of the semiconductor device to reduce the degree of the plasma damage.

26. The system according to claim 20, further comprising an index coefficient setting unit connected to the index calculation unit for setting an individual index coefficient for allowing the index calculation unit to calculate the individual damage index by use of the individual index coefficient.

* * * * *